(12) United States Patent
Papavasiliou et al.

(10) Patent No.: US 10,084,035 B2
(45) Date of Patent: Sep. 25, 2018

(54) VERTICAL CAPACITOR CONTACT ARRANGEMENT

(71) Applicant: Teledyne Scientific & Imaging, LLC, Thousand Oaks, CA (US)

(72) Inventors: Alexandros P. Papavasiliou, Thousand Oaks, CA (US); Jeffrey F. DeNatale, Thousand Oaks, CA (US); David J. Gulbransen, Thousand Oaks, CA (US); Alan Roll, Oak Park, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 148 days.

(21) Appl. No.: 14/985,101

(22) Filed: Dec. 30, 2015

(65) Prior Publication Data

US 2017/0194418 A1    Jul. 6, 2017

(51) Int. Cl.
*H01L 27/14* (2006.01)
*H01L 29/66* (2006.01)
*H01L 29/94* (2006.01)
*H01L 49/02* (2006.01)
*H01L 23/532* (2006.01)
(Continued)

(52) U.S. Cl.
CPC ........ *H01L 28/60* (2013.01); *H01L 21/30604* (2013.01); *H01L 21/31051* (2013.01); *H01L 21/32051* (2013.01); *H01L 21/32133* (2013.01); *H01L 23/53228* (2013.01); *H01L 27/14609* (2013.01); *H01L 27/14634* (2013.01); *H01L 27/14636* (2013.01); *H01L 27/14643* (2013.01);
(Continued)

(58) Field of Classification Search
CPC .............. H01L 26/60; H01L 23/53228; H01L 27/14609; H01L 27/14634; H01L 27/14636; H01L 27/14643; H01L 2/60; H01L 27/146438; H01L 28/90; H01L 29/66181; H01L 29/945
See application file for complete search history.

(56) References Cited

U.S. PATENT DOCUMENTS 4,859,622 A * 8/1989 Eguchi .............. H01L 27/10829
257/E21.396
6,380,578 B1 * 4/2002 Kunikiyo ................ H01L 21/84
257/296
(Continued)

*Primary Examiner* — Ida M Soward
(74) *Attorney, Agent, or Firm* — Koppel, Patrick, Heybl & Philpott

(57) ABSTRACT

An arrangement for making electrical contact to a vertical capacitor having top and bottom metal layers separated by a dielectric, and at least one trench. Recesses are formed in an oxide layer over the capacitor to provide access to the top and bottom metal layers. The recesses include contacting portions preferably positioned such that there is no overlap between them and any of the trenches. Metal in the recesses, preferably copper, forms electrical contacts to the vertical capacitor's metal layers and enables reliable bonding to copper metallization on other layers such as an ROIC layer. 'Dummy' capacitors may be tiled on portions of the IC where there are no vertical capacitors, preferably with the top surfaces of their top metal at a height approximately equal to that of the top surface of the vertical capacitor's top metal, thereby enabling the IC to be planarized with a uniform planarization thickness.

17 Claims, 7 Drawing Sheets

(51) Int. Cl.
    *H01L 27/146*    (2006.01)
    *H01L 21/306*    (2006.01)
    *H01L 21/3205*    (2006.01)
    *H01L 21/3213*    (2006.01)
    *H01L 21/3105*    (2006.01)

(52) U.S. Cl.
    CPC ........ *H01L 28/90* (2013.01); *H01L 29/66181* (2013.01); *H01L 29/945* (2013.01)

(56) References Cited

U.S. PATENT DOCUMENTS

| | | | |
|---|---|---|---|
| 7,312,131 B2* | 12/2007 | Wu | H01L 27/10855 257/307 |
| 7,667,292 B2* | 2/2010 | Giraudin | H01L 27/0805 257/532 |
| 7,682,925 B2* | 3/2010 | Kim | H01L 27/0805 257/301 |
| 7,683,413 B2* | 3/2010 | Graettinger | H01L 27/10817 257/296 |
| 8,053,309 B2* | 11/2011 | Lee | H01L 21/823481 257/301 |
| 8,487,405 B2* | 7/2013 | Tian | H01L 27/0805 257/532 |
| 8,492,818 B2* | 7/2013 | Wong | H01L 27/10861 257/301 |
| 8,519,510 B2* | 8/2013 | Doyle | H01L 27/10817 257/532 |
| 8,648,441 B2* | 2/2014 | Hijioka | H01L 23/5223 257/532 |
| 8,659,066 B2* | 2/2014 | Cheng | H01L 27/0629 257/310 |
| 8,946,800 B2* | 2/2015 | Kume | H01L 27/10808 257/296 |
| 9,159,723 B2* | 10/2015 | Chou | H01L 29/66181 |
| 9,178,080 B2* | 11/2015 | Kalnitsky | H01L 29/945 |
| 9,209,190 B2* | 12/2015 | Chen | H01L 27/10829 |
| 9,385,179 B2* | 7/2016 | Nakos | H01L 29/66181 |
| 9,466,663 B2* | 10/2016 | Hsu | H01L 28/90 |
| 9,472,690 B2* | 10/2016 | Weng | H01L 29/66181 |
| 9,564,217 B1* | 2/2017 | Zhou | G11C 14/0009 |
| 2002/0192901 A1* | 12/2002 | Kimura | H01L 21/32136 438/243 |
| 2003/0011002 A1* | 1/2003 | Takaura | H01L 21/76895 257/200 |
| 2003/0213989 A1* | 11/2003 | Delpech | H01L 23/5223 257/301 |
| 2004/0113235 A1* | 6/2004 | Coolbaugh | H01L 21/76807 257/532 |
| 2005/0013090 A1* | 1/2005 | Ahrens | H01L 29/66181 361/306.3 |
| 2007/0228427 A1* | 10/2007 | Matsui | H01L 27/10852 257/288 |
| 2008/0237794 A1* | 10/2008 | Shoji | H01G 4/012 257/532 |
| 2011/0073994 A1* | 3/2011 | Liu | C23C 18/1216 257/532 |
| 2012/0061798 A1* | 3/2012 | Wong | H01L 27/10861 257/532 |
| 2013/0147015 A1* | 6/2013 | Nakos | H01L 29/66181 257/534 |
| 2013/0161792 A1* | 6/2013 | Tran | H01L 29/92 257/534 |
| 2014/0220749 A1* | 8/2014 | Rutter | H01L 29/7803 438/243 |
| 2015/0061069 A1* | 3/2015 | Friedrich | H01L 28/91 257/506 |
| 2015/0270271 A1* | 9/2015 | Sakamoto | H01L 27/10814 257/306 |
| 2015/0380480 A1* | 12/2015 | Ozawa | H01L 27/10855 257/296 |
| 2016/0020267 A1* | 1/2016 | Lin | H01L 29/945 257/532 |
| 2016/0218071 A1* | 7/2016 | Nam | H01L 23/576 |
| 2016/0254343 A1* | 9/2016 | Zhang | H01L 28/60 |
| 2017/0250029 A1* | 8/2017 | Yamamoto | H01G 4/40 |

* cited by examiner

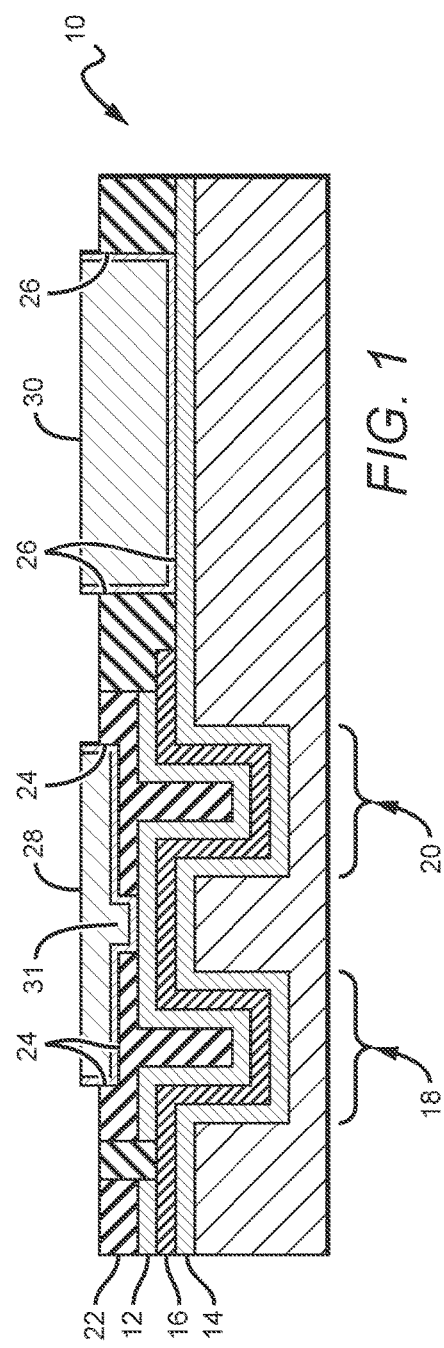
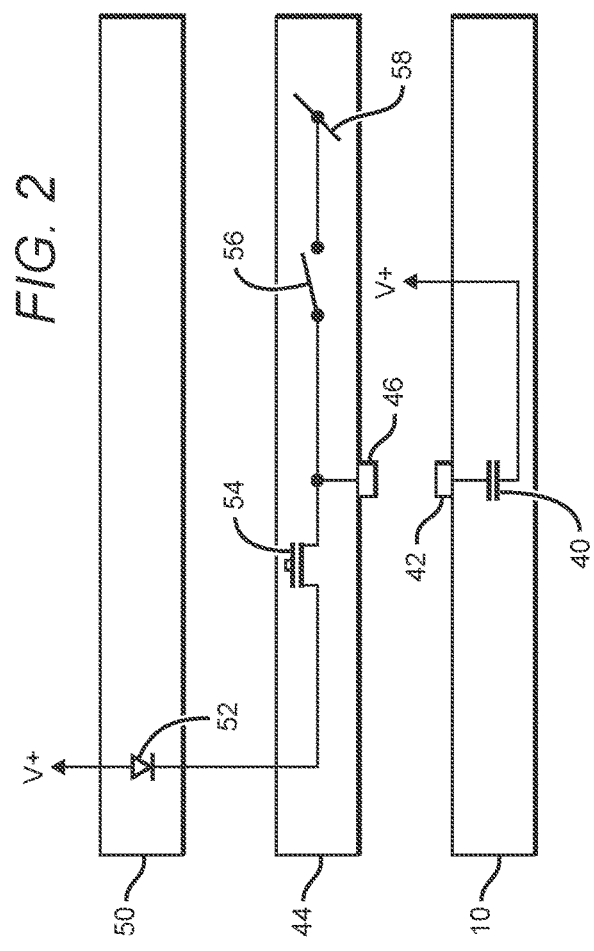

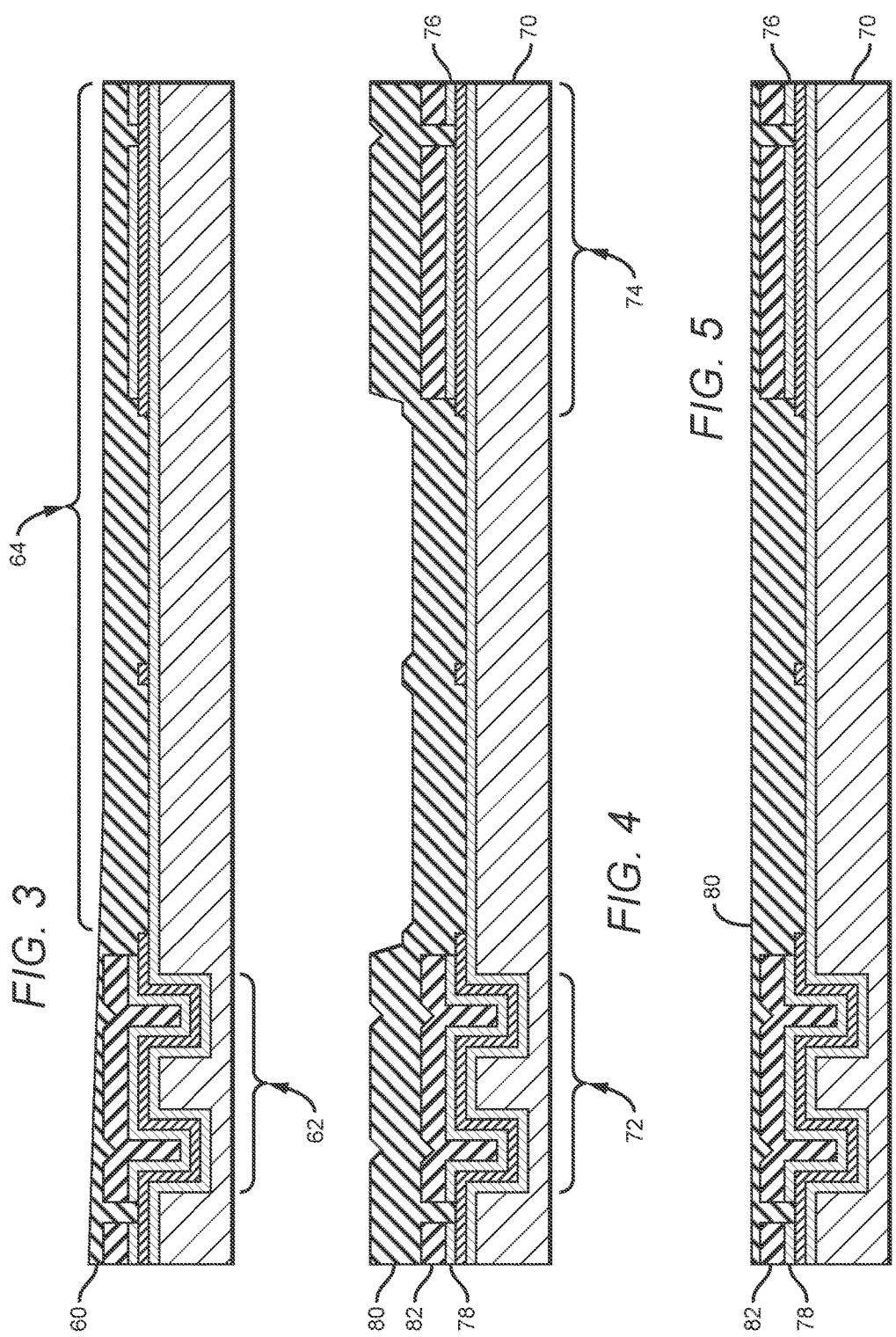

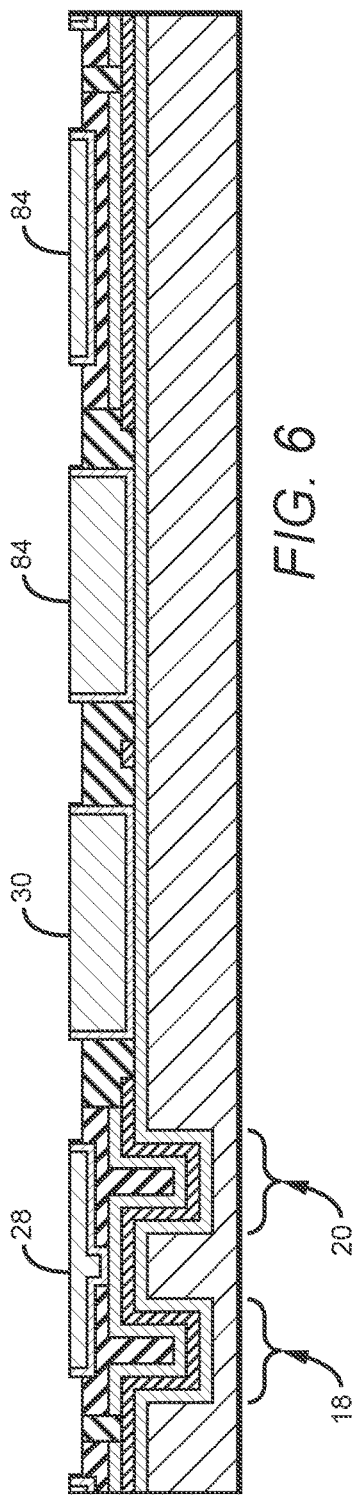
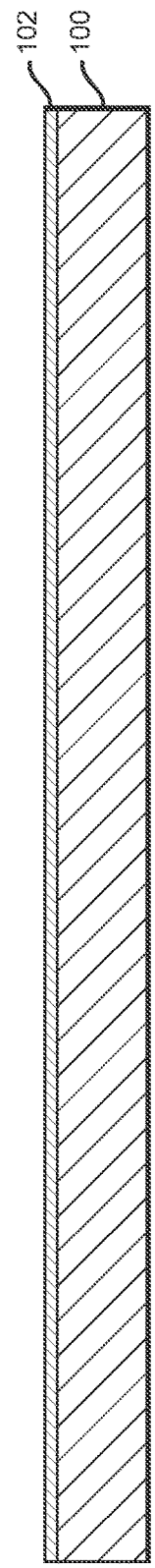
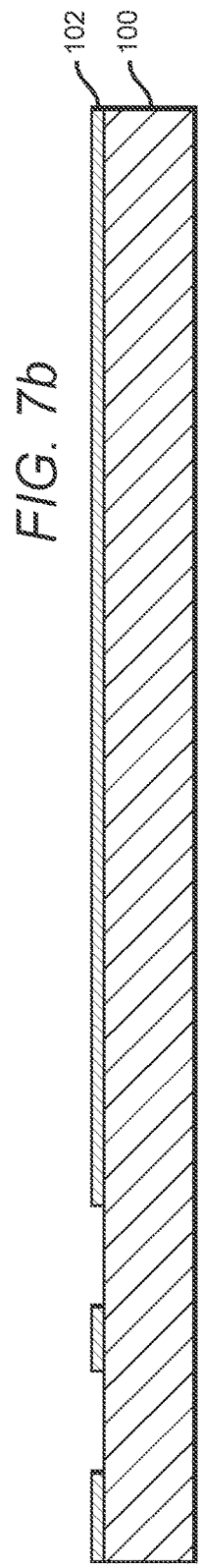

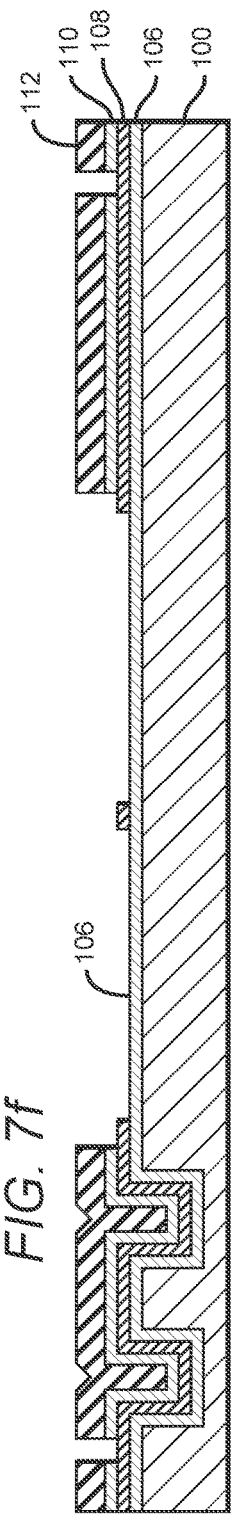
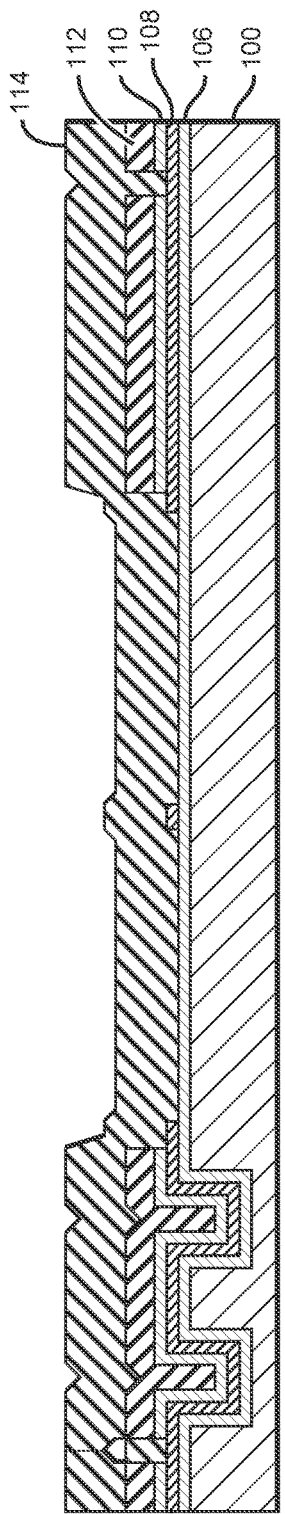
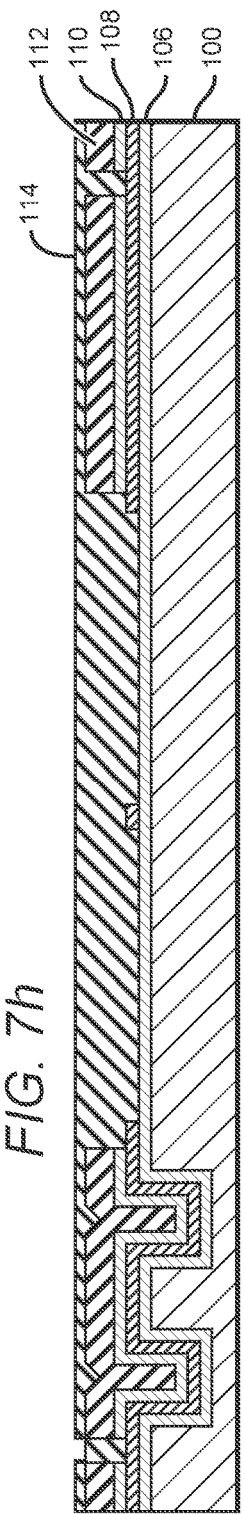
FIG. 7f
FIG. 7g
FIG. 7h

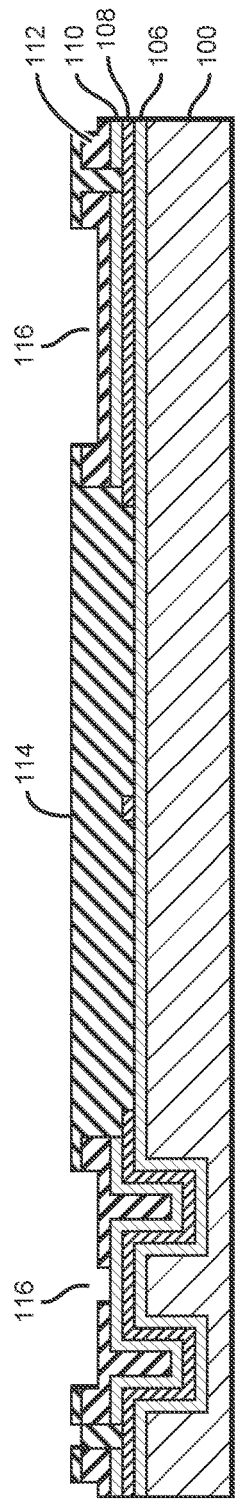
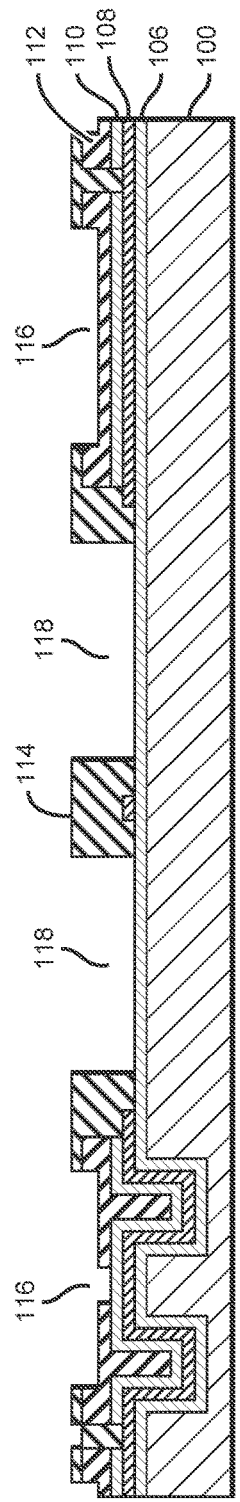
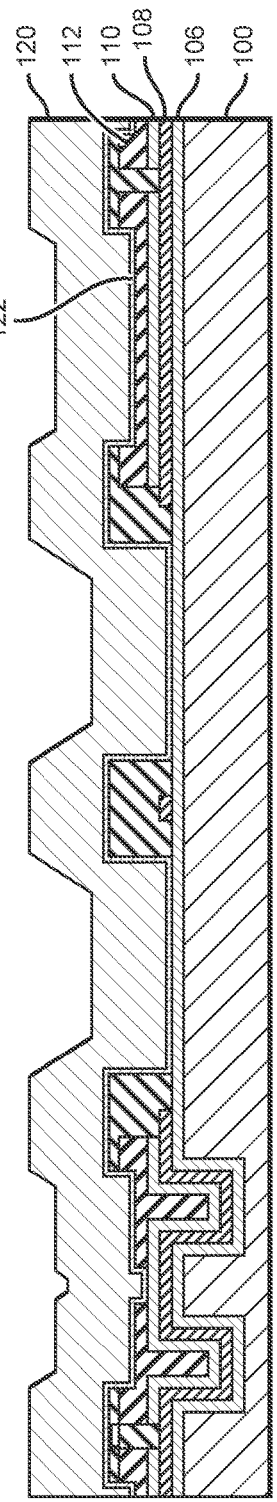

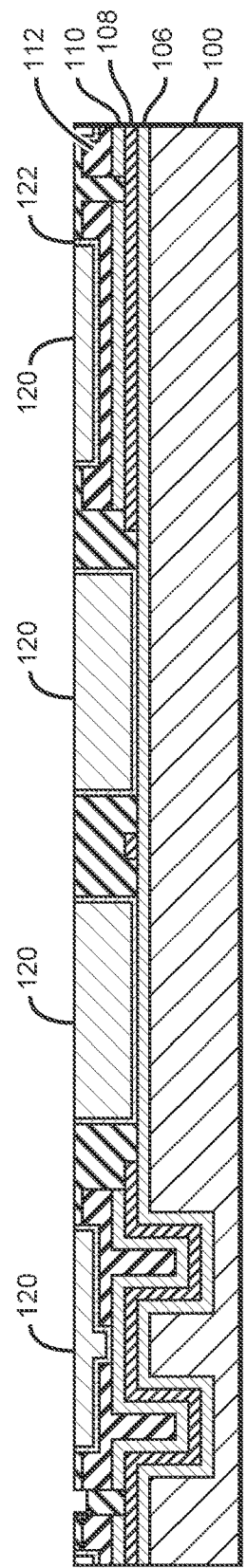
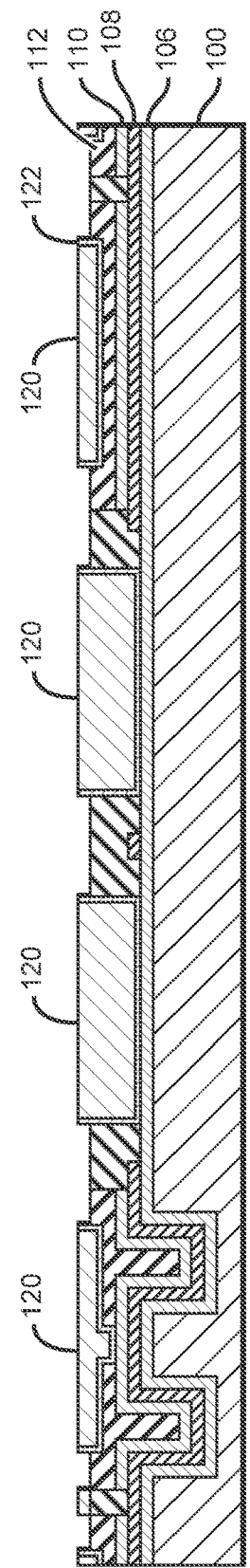

VERTICAL CAPACITOR CONTACT ARRANGEMENT

GOVERNMENT LICENSE RIGHTS

This invention was made with Government support under contract W31P4Q-09-C-0513 awarded by the Defense Advanced Research Projects Agency (DARPA). The Government has certain rights in this invention.

BACKGROUND OF THE INVENTION

Field of the Invention

This invention relates generally to vertical capacitors on integrated circuits (ICs), and more particularly to a vertical capacitor contact arrangement and method of fabricating same.

Description of the Related Art

A conventional imaging array comprises an array of pixels, each of which includes a photodetector and the input circuit of a "readout IC" (ROIC) which contains both a capacitor which stores the charge generated by the photodetector in response to light, and electrical circuitry to convey the charge from the photodiode to the capacitor and from the capacitor to further processing circuitry of the ROIC. The ROIC and charge storage capacitors are typically fabricated together using an electronic circuit process, such as CMOS, with the size of each charge storage capacitor limited in part by the size of each pixel and the complexity of the circuit.

Problems may arise when a high-density imaging array is needed. A higher density array requires that the pixel size be small. However, a significant limitation is encountered when attempting to scale to smaller pixel size, in that a smaller pixel necessitates a smaller charge storage capacitor, which serves to reduce the amount of charge that can be stored. This has an adverse effect on the array's sensitivity, typically reflected in the "noise equivalent differential temperature" (NEDT) value, which is a measure of the lowest signal flux level that can be detected by the array. The NEDT value might be lowered by making the charge storage capacitors larger, but this would consume circuit area that might otherwise be used to increase circuit functionality. These factors combine to impede the realization of high performance (low NEDT), high-functionality imaging arrays with small pixel pitch.

One way of overcoming the limitations associated with the ROIC and charge storage capacitors being fabricated together is to provide a separate charge storage capacitor layer which is distinct from the photodetector and ROIC layers; the layers are electrically interconnected to form the array. The capacitors within the charge storage capacitor layer may be, for example, vertical capacitors comprising a microstructured surface coated with sequential conductive-insulating-conductive thin-film coatings. However, problems can arise with some vertical capacitor designs. Electrical contact needs to be made to the top and bottom conductive layers of each capacitor. In some cases, the recesses in which metal is deposited to make contact to the top conductive layer can be overetched. The corners of the tops of the walls between the trenches are particularly vulnerable to overetching. This can result in damage to or breaching of the dielectric layer which results in reduced breakdown voltage or shorting. In addition, the trenches are often not completely filled with the planarizing oxide layer, but merely pinched off. Overetching can breach the pinchoff area, opening the voids in the trenches to copper plating which results in plating non-uniformity and extra stress during subsequent thermal cycling events.

The overetching problem is exacerbated at the edges of a capacitor array where there is a sharp step from the plateau of the array down to the rest of the field. The chemical-mechanical planarization process acts to smooth out this transition, resulting in an extra thin layer of planarization oxide at the edges of the field.

SUMMARY OF THE INVENTION

A contact arrangement for making electrical contact to a vertical capacitor on an integrated circuit (IC) is presented, which addresses several of the problems noted above.

The contact arrangement is for use with a vertical capacitor having a top metal and a bottom metal separated by a dielectric, and at least one trench. The arrangement requires a first oxide layer over the vertical capacitor, and a recess in the first oxide layer which provides access to one of the vertical capacitor's top or bottom metal layers. Metal deposited in the recess forms an electrical contact to the vertical capacitor's metal layer. The metal is preferably copper, which enables reliable bonding to copper metallization on other layers such as an ROIC layer.

Each recess includes a contacting portion which contacts the top metal. The vertical capacitor typically comprises at least two adjacent trenches, with the contacting portion of a recess approximately centered between adjacent trenches such that there is no overlap between the contacting portion and any of said trenches. A recess providing access to the vertical capacitor's top metal is preferably T-shaped, with the vertical portion of the T being the contacting portion. In this way, the overetching issues described above may be avoided. The present contact arrangement is typically employed to provide contact to an array of vertical capacitors, each of which has a top metal and a bottom metal separated by a dielectric and at least one trench.

'Dummy' capacitors may be tiled on portions of the IC where there are no vertical capacitors, arranged such that the top surfaces of their top metal are at a height approximately equal to that of the top surface of the vertical capacitor's top metal. This enables the IC to be planarized with a uniform planarization thickness.

These and other features, aspects, and advantages of the present invention will become better understood with reference to the following drawings, description, and claims.

BRIEF DESCRIPTION OF THE DRAWINGS

FIG. 1 is a sectional view of an IC which includes the present vertical capacitor contact arrangement.

FIG. 2 is a diagram illustrating an IC which includes the present vertical capacitor contact arrangement as it might be used with additional ICs or device layers.

FIG. 3 is a sectional view of an IC which includes the present vertical capacitor contact arrangement and has been planarized.

FIG. 4 is a sectional view of an IC which includes the present vertical capacitor contact arrangement and a dummy capacitor, over which a second layer of oxide has been deposited.

FIG. 5 is a sectional view of the IC of FIG. 4, after it has been planarized.

FIG. 6 is a sectional view of an IC which includes the present vertical capacitor contact arrangement on an IC which includes a dummy capacitor.

FIG. 7a-7m are sectional views illustrating one possible fabrication sequence for providing the present vertical capacitor contact arrangement on an IC.

DETAILED DESCRIPTION OF THE INVENTION

Figure 7C:
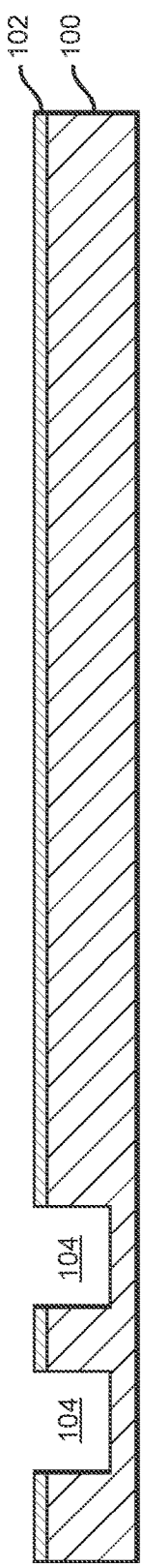

The present contact arrangement is for making electrical contact to a vertical capacitor on an IC, in which the capacitor includes a top metal and a bottom metal separated by a dielectric, and at least one trench. The contact arrangement is illustrated in the sectional view of a first IC 10, shown in FIG. 1. The vertical capacitor includes a top metal layer 12 and a bottom metal layer 14 separated by a dielectric 16, formed into a structure which includes at least one trench; two trenches 18, 20 are shown in the exemplary embodiment of FIG. 1 though a typical vertical capacitor (per pixel) has about 5 trenches. The top and bottom metal layers preferably comprise TiN. The dielectric layer 16 between the top and bottom metals preferably comprises hafnium oxide.

The contact arrangement is effected by providing a dielectric layer 22, preferably silicon dioxide, over the vertical capacitor. A recess is formed in dielectric layer 22 which provides access to one of the vertical capacitor's top or bottom metal layers; FIG. 1 includes a first recess 24 which provides access to top metal layer 12 and a second recess 26 which provides access to bottom metal layer 14.

Metal is formed in each recess to provide electrical contact to the metal layer the recess provides access to. Thus, in FIG. 1, metal 28 is formed in first recess 24 and provides electrical contact to top metal layer 12, and metal 30 is formed in second recess 26 and provides electrical contact to bottom metal layer 14.

As shown in FIG. 1, a recess 24 which provides access to the vertical capacitor's top metal 12 includes a contacting portion 31 which contacts the top metal; the contacting portion is preferably narrower than the upper portion of the recess. A vertical capacitor typically comprises at least two adjacent trenches, such as trenches 18 and 20 in FIG. 1; when so arranged, the contacting portion 31 of a recess is approximately centered between adjacent trenches such that there is no overlap between the contacting portion and any of the trenches. This reduces the chances of overetching at the trench corners. Though recess 24 can have a number of different shapes, it is preferably T-shaped as shown in FIG. 1, with the narrower vertical portion of the T being the contacting portion. The horizontal top portion of the T-shaped recess should have a top surface area that is sufficient for subsequent bonding processes.

Positioning the recesses such that there is no overlap between a contacting portion of a recess and any of the trenches reduces the chances of overetching at the vulnerable trench corners, thereby avoiding shorting problems that might otherwise arise. This recess positioning also serves to avoid overetching that might otherwise result in breaching oxide pinch-off in the vertical capacitor trenches 18, 20, as the dielectric 22 over the trenches is left unetched.

The metal 28, 30 formed in the recesses is preferably copper. The copper serves to provide electrical contact to the capacitor's metal layers, as well as serving as an effective bonding contact with which to provide interconnection to other structures. For example, a second IC or semiconductor layer may need to be interconnected to one or more vertical capacitors on first IC 10 via one or more electrical contacts. One way to effect this is to provide electrical contacts on the second IC and on IC 10 that make contact to each other when the ICs are aligned in a predetermined manner This is illustrated in FIG. 2. Here, first IC 10 includes vertical capacitors represented by capacitor 40, which includes a contact 42, preferably copper, formed as described herein. A second IC 44 with which IC 10 is to be interconnected includes a contact 46, also preferably copper. To effect the interconnection between ICs 10 and 44, contacts 42 and 46 are pressed together such that a bond is formed.

Second IC 44 might be, for example, a readout IC (ROIC). Such a system might also include a third IC or layer 50 which includes an array of photodetectors 52. Here, IC 10 would typically include an array of vertical capacitors 40 which serve as charge storage capacitors for the photodetector array. ROIC 44 would typically comprise a metering circuit—preferably a direct injection transistor 54—between each photodetector and charge storage capacitor, and a switch 56 between each charge storage capacitor and a pixel column busline 58; each pixel of the array would typically include one of each of these components.

A problem can arise under certain circumstances when employing a vertical capacitor structure with the present contact arrangement; this is illustrated in FIG. 3. Due to the structure of the vertical capacitors, materials such as an oxide layer 60 deposited over the IC can result in as much as 5500A more material over the capacitors 62 as compared with the areas 64 without capacitors. If the IC is then planarized (chemical-mechanical planarization (CMP), for example), the planarization thins the oxide more at the edge of the array than in the center, which is undesirable as the thin oxide may result in overetching and shorting.

One possible solution to this problem is shown in FIG. 4. An IC substrate 70 includes at least one vertical capacitor 72, but further comprises one or more dummy capacitors 74 tiled on portions of the IC where there are no vertical capacitors. The dummy capacitors are preferably arranged such that the top surfaces of their top metal layer 76 are at a height approximately equal to that of the top surface 78 of the vertical capacitor's top metal layer. With dummy capacitors tiled as described, planarizing an oxide layer 80 deposited over the oxide layer 82 immediately above the vertical capacitor structures results in an oxide layer of uniform thickness. This is illustrated in FIG. 5. Eliminating thickness variation across the array in this way can avoid overetching and shorting that might otherwise occur.

The use of the present contact arrangement with an IC containing both vertical capacitors and dummy capacitors as described herein is shown in FIG. 6. Additional recesses are formed and filled with metal to provide contacts 84 to the dummy capacitors if needed.

One possible process for fabricating vertical capacitors and a contact arrangement as described herein is illustrated in FIGS. 7a-7m. In FIG. 7a, a substrate 100, preferably silicon, is provided, and an oxide hard mask 102, preferably TEOS oxide, is deposited on the substrate. Trenches 104 are next patterned and etched in substrate 100: in FIG. 7b, the oxide is etched where trenches are to be formed, and in FIG. 7c, the silicon substrate is etched to complete the trenches.

Figure 7D:
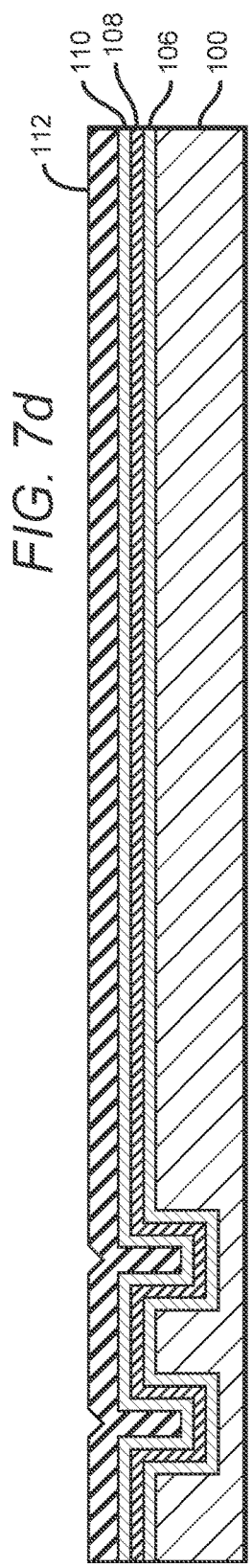

The capacitor layers are deposited next. In FIG. 7d, a bottom metal layer 106 is deposited, suitably TiN and 500 Å thick, followed by a dielectric layer such as an oxide layer 108, suitably hafnium oxide and 500 Å thick, and a top metal layer 110 (suitably TiN/500 Å). This is followed by an oxide deposition 112 over the entire IC.

Figure 7E:
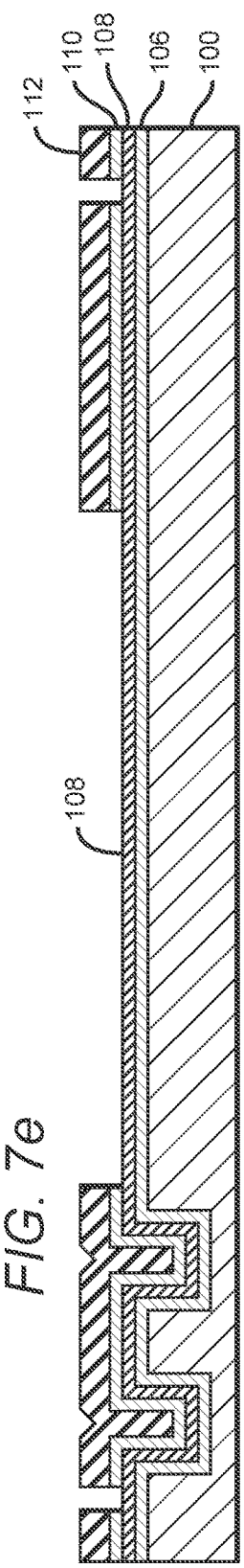

In FIG. 7e, oxide layer 108 and top metal layer 110 are etched as needed to begin the process of providing access to bottom metal layer 106. Access is completed in FIG. 7f with the etching of oxide layer 108 down to bottom metal layer 106.

Another oxide layer 114, suitably TEOS oxide 10,000 Å thick, is deposited over the IC in FIG. 7g, which is then planarized in FIG. 7h. In FIGS. 7i and 7j, oxide layers 114 and 112 are etched to form recesses 116 for accessing the top metal layers of the vertical capacitors and recesses 118 for accessing the bottom metal layers. Recesses providing access to the top metal layer of a vertical capacitor are preferably T-shaped.

Contact metal 120 is deposited over the entire IC in FIG. 7k. Metal 120 is preferably copper (suitably 7000 Å thick), with the copper deposition preferably preceded by the deposition of a seed layer 122, preferably tantalum and copper. Following an anneal, a planarization step is performed as shown in FIG. 7l. Finally, in FIG. 7m, oxide layer 114 is etched to expose the top portions of the electrical contacts.

The process depicted in FIGS. 7a-7m is merely exemplary; there are numerous means by which a vertical capacitor contact arrangement as described herein could be fabricated.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A vertical capacitor contact arrangement for making electrical contact to a vertical capacitor on a first integrated circuit (IC), said vertical capacitor having a top metal and a bottom metal separated by a dielectric, and at least two adjacent trenches, comprising:
    a first oxide layer over said vertical capacitor and in said at least two adjacent trenches;
    a single recess in said first oxide layer which provides access to said vertical capacitor's top metal layer; and
    metal in said single recess such that said metal provides an electrical contact to the top metal layer to which said recess provides access;
    said single recess having a single contacting portion which contacts said top metal;
    said contacting portion of said single recess approximately centered between adjacent ones of said trenches such that there is no overlap between said contacting portion and any of said trenches.

2. The contact arrangement of claim 1, wherein said metal is copper.

3. The contact arrangement of claim 1, wherein said single recess is T-shaped, with the vertical portion of said T being said contacting portion.

4. The contact arrangement of claim 1, wherein said single recess is T-shaped, with the horizontal top portion of said T-shaped recess having a top surface area that is sufficient for subsequent bonding processes.

5. The contact arrangement of claim 1, wherein said top and bottom metal layers are TiN.

6. A vertical capacitor contact arrangement for making electrical contact to a vertical capacitor on a first integrated circuit (IC), said vertical capacitor having a top metal and a bottom metal separated by a dielectric, and at least one trench, comprising:
    a first oxide layer over said vertical capacitor;
    a recess in said first oxide layer which provides access to one of said vertical capacitor's top or bottom metal layers; and
    metal in said recess such that said metal provides an electrical contact to the top or bottom metal layer to which said recess provides access;
    further comprising a second IC having an electrical contact arranged to contact said electrical contact to the top or bottom metal layer to which said recess provides access when said first and second ICs are aligned in a predetermined manner.

7. The contact arrangement of claim 6, wherein said electrical contacts on said first and second ICs are copper and said copper electrical contacts on said first and second ICs bond said first and second ICs together.

8. The contact arrangement of claim 6, wherein said first IC comprises a vertical capacitor array and said second IC is a readout IC (ROIC).

9. The contact arrangement of claim 8, further comprising a third IC comprising an array of photodetectors, said vertical capacitor array arranged to store charge produced by said array of photodetectors.

10. A vertical capacitor contact arrangement for making electrical contact to a vertical capacitor on a first integrated circuit (IC), said vertical capacitor having a top metal and a bottom metal separated by a dielectric, and at least one trench, comprising:
    a first oxide layer over said vertical capacitor;
    a recess in said first oxide layer which provides access to one of said vertical capacitor's top or bottom metal layers; and
    metal in said recess such that said metal provides an electrical contact to the top or bottom metal layer to which said recess provides access;
    wherein said first IC includes a substrate, said vertical capacitor being on said substrate, further comprising dummy capacitors tiled on portions of said first IC where there are no vertical capacitors, said dummy capacitors arranged such that the top surfaces of their top metal are at a height approximately equal to that of the top surface of said vertical capacitor's top metal.

11. A vertical capacitor contact arrangement for making electrical contact to a vertical capacitor on a first integrated circuit (IC), said vertical capacitor having a top metal and a bottom metal separated by a dielectric, and at least two adjacent trenches, comprising:
    a first oxide layer over said vertical capacitor;
    a single recess in said first oxide layer which provides access to one of said vertical capacitor's top metal layer;
    metal in said single recess such that said metal provides an electrical contact to the top metal layer to which said recess provides access;
    said single recess having a single contacting portion which contacts said top metal layer;
    said contacting portion of said single recess approximately centered between adjacent ones of said trenches such that there is no overlap between said contacting portion and any of said trenches; and
    a planarized oxide layer over said first oxide layer.

12. The contact arrangement of claim 11, wherein the dielectric layer between said vertical capacitor's top and bottom metals comprises hafnium oxide and said first oxide layer comprises silicon dioxide.

13. A vertical capacitor array, comprising:
an integrated circuit (IC) having a substrate on which an array of vertical capacitors has been fabricated, each of said vertical capacitors having a top metal and a bottom metal separated by a dielectric, and at least two adjacent trenches;
a first oxide layer over said array of vertical capacitors;
a plurality of recesses in said first oxide layer, each of which provides access to the top metal layer of a respective one of said vertical capacitors, each of said vertical capacitors having an associated single recess providing access to its top metal layer, each of said recesses having a single contacting portion which contacts said top metal layer, said contacting portion of each recess approximately centered between adjacent ones of said trenches such that there is no overlap between said contacting portion and any of said trenches; and
copper in said recesses such that, for each of said recesses, said copper provides electrical contacts to the top or bottom metal layer to which said recess provides access.

14. The vertical capacitor array of claim 13, said recesses which provide access to said vertical capacitors' top metal being T-shaped with the vertical portions of said Ts contacting said capacitors' top metal.

15. A vertical capacitor array, comprising:
an integrated circuit (IC) having a substrate on which an array of vertical capacitors has been fabricated, each of said vertical capacitors having a top metal and a bottom metal separated by a dielectric, and at least one trench;
a first oxide layer over said array of vertical capacitors;
a plurality of recess in said first oxide layer, each of which provides access to the top or bottom metal layer of a respective one of said vertical capacitors;
copper in said recesses such that, for each of said recesses, said copper provides electrical contact to the top or bottom metal layer to which said recess provides access; and
a second IC having one or more copper electrical contacts arranged to contact respective ones of said copper electrical contacts on said first IC when said first and second ICs are aligned in a predetermined manner, said copper electrical contacts on said first and second ICs bonding said first and second ICs together.

16. The vertical capacitor array of claim 15, wherein said second IC is a readout IC (ROIC).

17. The vertical capacitor array of claim 16, further comprising a third IC comprising an array of photodetectors, said vertical capacitor array arranged to store charge produced by said array of photodetectors.

* * * * *